United States Patent [19]
Runge-Marchese et al.

[11] Patent Number: 5,980,723
[45] Date of Patent: Nov. 9, 1999

[54] ELECTROCHEMICAL DEPOSITION OF A COMPOSITE POLYMER METAL OXIDE

[75] Inventors: Jude Mary Runge-Marchese, Villa Park; Michael McNallan, Oak Park, both of Ill.

[73] Assignee: Jude Runge-Marchese, Villa Park, Ill.

[21] Appl. No.: 08/918,919

[22] Filed: Aug. 27, 1997

[51] Int. Cl.$^6$ .................................................. C25D 15/00
[52] U.S. Cl. .......................... 205/316; 205/317; 205/332; 205/333
[58] Field of Search ..................................... 205/317, 198, 205/199, 200, 201, 321, 322, 324, 332, 333, 171, 172

[56] References Cited

U.S. PATENT DOCUMENTS

| | | |
|---|---|---|
| 4,025,681 | 5/1977 | Donnelly et al. . |
| 4,324,815 | 4/1982 | Mitani et al. . |
| 4,769,115 | 9/1988 | Satoh et al. ............................ 204/59 R |
| 4,812,375 | 3/1989 | Foster . |
| 4,820,595 | 4/1989 | MacDiarmid et al. . |
| 4,839,002 | 6/1989 | Pernick et al. . |
| 4,879,018 | 11/1989 | Fenoglio et al. . |
| 4,940,640 | 7/1990 | MacDiarmid . |
| 4,943,892 | 7/1990 | Tsuchiya et al. . |
| 5,017,272 | 5/1991 | Kamigawa ............................ 204/56.1 |
| 5,023,149 | 6/1991 | MacDiarmid et al. . |
| 5,035,940 | 7/1991 | Winton et al. . |
| 5,039,583 | 8/1991 | Epstein et al. . |
| 5,079,334 | 1/1992 | Epstein et al. . |
| 5,106,537 | 4/1992 | Nelsen et al. . |
| 5,132,003 | 7/1992 | Mitani . |
| 5,137,991 | 8/1992 | Epstein et al. . |
| 5,147,913 | 9/1992 | MacDiarmid et al. . |
| 5,164,465 | 11/1992 | Epstein et al. . |
| 5,177,187 | 1/1993 | MacDiarmid et al. . |
| 5,198,693 | 3/1993 | Imken et al. . |
| 5,217,649 | 6/1993 | Kulkarni et al. . |
| 5,258,472 | 11/1993 | MacDiarmid et al. . |
| 5,276,112 | 1/1994 | MacDiarmid et al. . |
| 5,281,363 | 1/1994 | Shacklette et al. . |
| 5,290,483 | 3/1994 | Kulkarni et al. . |
| 5,300,208 | 4/1994 | Angelopoulos et al. . |
| 5,312,686 | 5/1994 | MacDiarmid et al. . |
| 5,403,913 | 4/1995 | MacDiarmid et al. . |
| 5,415,762 | 5/1995 | Allardyce et al. . |
| 5,422,194 | 6/1995 | Satoh . |
| 5,427,841 | 6/1995 | De Leeuw et al. . |
| 5,484,884 | 1/1996 | MacDiarmid et al. . |
| 5,498,761 | 3/1996 | Wessling et al. . |
| 5,519,111 | 5/1996 | MacDiarmid et al. . |
| 5,556,518 | 9/1996 | Kinlen et al. ............................ 204/484 |
| 5,556,700 | 9/1996 | Kaneto et al. . |
| 5,567,209 | 10/1996 | Kobayashi et al. . |
| 5,567,355 | 10/1996 | Wessling et al. . |
| 5,620,800 | 4/1997 | De Leeuw et al. . |
| 5,645,890 | 7/1997 | MacDiarmid et al. . |
| 5,720,903 | 2/1998 | Wessling et al. . |
| 5,721,056 | 2/1998 | Wessling . |
| 5,773,568 | 6/1998 | MacDiarmid et al. . |
| 5,779,818 | 7/1998 | Wessling . |

FOREIGN PATENT DOCUMENTS

| | | |
|---|---|---|
| 39 04 661 | 8/1990 | Germany . |
| WO97/07901 | 3/1997 | WIPO . |

OTHER PUBLICATIONS

1.) Huang, et al., A Novel Conducting Polymer—Morphology and Chemistry of Its Oxidation and Reduction in Aqueous Electrolytes. *J. Chem. Soc.*, Faraday Trans. 1, 82(1986), pp. 2385–2400. *No Month Available.
2.) Chiang, et al., 'Polyaniline:': Protonic Acid Doping of the Emeraldine Form to the Metallic Regime, *Synthetic Metals*, 13(1986), pp. 193–205. No Month Available.
3.) Parkhutic et al "Deposition of Polyaniline Films Onto Porous Silicon Layers" *J. Electrochem. Soc.*, vol. 140, No. 6, Jun. 1993, pp. L94–L95. No Month Available.
4.) Angelopoulis et al "Conducting Polyanilines: Applications in Computer Manufacturing" *Proceedings of the SPE 49th Annual Technical Conference & Exhibits*, 1991, pp. 765–769. No Month Available.
5.) Nishio et al "Electrochemical Characteristics of Polyaniline Synthesized by Various Methods" *J of Power Sources (Switzerland)*,56 (1995), pp. 189–192. No Month Available.
6.) Paul et al "Resistance of Polyaniline Films as a Function of Electrochemical Potential and the Fabrication of Polyaniline–based Microelectronics Devices" *J Phys. Chem.*, 89(1995), pp. 1441–1447. No Month Available.

(List continued on next page.)

*Primary Examiner*—Kathryn Gorgos
*Assistant Examiner*—Wesley A. Nicolas
*Attorney, Agent, or Firm*—Niro, Scavone, Haller & Niro

[57] ABSTRACT

A process for forming polymer films through electrochemical techniques utilizing electrolytes which include conductive polymer. The resulting polymer films are electrically conductive and corrosion and wear resistant. Poyaminobenzene (polyaniline), for example, undergoes an insulator-to-metal transition upon doping with protonic acids in an acid/base-type reaction. Composite polymer-aluminum oxide films may be formed by modifying the anodizing electrolyte, resulting in the codeposition of polyaniline during aluminum anodization. A nonprotonated, ring-sulfonated aluminum salt of polyaniline was determined to be the reaction product within the aluminum oxide phase of the codeposited films. A second process, which incorporates electrochemical sealing of the anodic layer with polyaniline, was also developed.

The formation of these composite films is documented through experimental processing, and characterized through scientific analysis and engineering tests. Scientific characterization determined the codeposition process yields chemically and metallurgically bound composite films. Engineering testing determined the films, obtained through a single step, exhibit superior wear and comparable corrosion resistance to conventionally anodized and sealed films processed through two steps, demonstrating the increased manufacturing efficiency that can be realized using the processes of the present invention.

14 Claims, 5 Drawing Sheets

OTHER PUBLICATIONS

7.) Rothbarth, Frank. Dauerhafter Korrosionschutz mit Polyanilin *Jahrgang*, 1995, pp. 773–776. No Month Available.

8.) Huang et al "Application of Conductign Polyaniline to the Electrolytic Plating Process", *Proceedings of the SPE 49th Annual Technical Conference & Exhibit*, 1991, pp. 864–867. No Month Available.

9.) Yue et al "Effect of Sulfonic Acid Group on Polyaniline Backbone" *J Amer. Chem. Soc.*, 113, No. 7: 1991, pp. 2665–2671. No Month Available.

10.) Maeda et al "Electrochemical and Thermal Behavior of Polyaniline in Aqueous Solution Containing $SO_4^{2-}$–Ions" *J Electrochem. Soc*, vol. 142, No. 7, Jul. 1995, pp. 2261–2671.

11.) Johnson t al "Electrochemistry of Conductive Polymers" *J. Electrochem. Soc.*, Apr (1996), pp. 1277–1282.

12.) Brusic et al "Use of Polyaniline and Its Derivatives in Corrosion Protection of Copper and Silver," Research Report, Nov. 1995, 30 pages.

13.) Wan et al "Growth Mechanism of transparent and Conducting Composite Films of Polyaniline" *J Appl. Polymer Science*, Nov. 1993, pp. 1639–1645.

14.) Dinsmore et al "Entropic Control of Particle Motion Using Passive Surface Microstructures" *Nature*, Sep. 1996, pp. 239–242.

15.) Zhang et al "Interactions Between Polyaniline and Silver Cations" *J Electrochem Soc*, Mar. 1995, pp. 1097–1104.

16.) Li et al "Preparation and Characterization of Polyaniline–Palladium Composite Films" *J Electrochem Soc*, (1995), pp. 798–805. No Month Available.

17.) Skaarup et al "Polyaniline: Influence of Polymerization Current Density" *Mat Res. Soc.*, (1995), pp. 565–574. No Month Available.

18.) Diaz et al "Electroactive Polyaniline Films" *J Electroanalytical Chem*, (1980), pp. 111–114. No Month Available.

19.) Loglund et al "Electronic and Chemical Structure of Conjugated Polymers and Interfaces as Studied by Photoelectron Spectroscopy" Reprint from *Handbook Of Conducting Polymers*, 2nd ed, 1996. No Month Available.

20.) Blesa et al "Dissolution of Cobalt Ferrites by Thiogylcolic Acid" *J Electrochem Soc*, (1986), pp. 2345–2352.

21.) Huang et al "Coating of Uniform Inorganic Particles with Polymers II. Polyaniline on Copper Oxide" *J Colloid and Interface Science*, (1995), pp. 275–283. No Month Available.

22.) Segal et al "Kinetics of Metal Oxide Dissolution" *J Electrochem Soc*, (1982), pp. 1149–1164. No Month Available.

23.) Angelopoulos et al "Conducting Amic Acid/Polyaniline Blends" *Antec*, (1993), pp. 1650–1651. No Month Available.

24.) Clariant Chemical Company Anodizing Class Notes, "Anodizing". No Date Available.

25.) Von Fraunhofer, J.A., *Basic Metal Finishing*. Chemcical Publishing, 1976. No Month Available.

26.) Wernick, et al.,*The Surface Treatment and Finishing of Aluminum and Its Alloy*. vol. 1 5th Edition, ASM International, Metal Parks, Ohio, 1987. No Month Available.

27.) Jones, D.A., *Principles and Prevention of Corrosion*, MacMillan, 1992. No Month Available.

28.) Stone, et al., "Reductive Dissolution of Metal Oxides", *Aquatic Surface Chemistry, Chemical Processes at the Particle–Water Interface*. W. Stumm, ed., John Wiley & Sons, 1987, pp. 221–254. No Month Available.

29.) Morrison, et al.,*Organic Chemistry*, Allyn and Bacon, 1973. No Month Available.

FIGURE 3

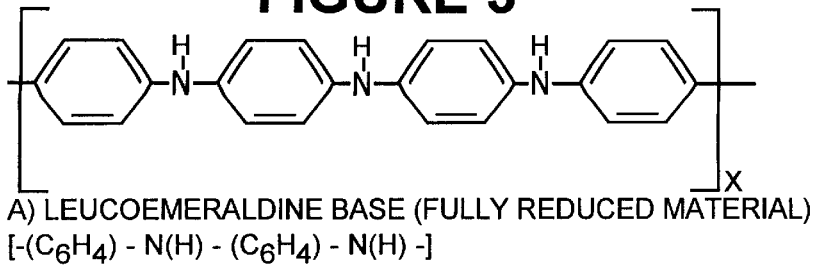

A) LEUCOEMERALDINE BASE (FULLY REDUCED MATERIAL)
[-($C_6H_4$) - N(H) - ($C_6H_4$) - N(H) -]
CHARACTERISTIC VOLTAGE RANGE: 0 TO 0.4 VOLTS

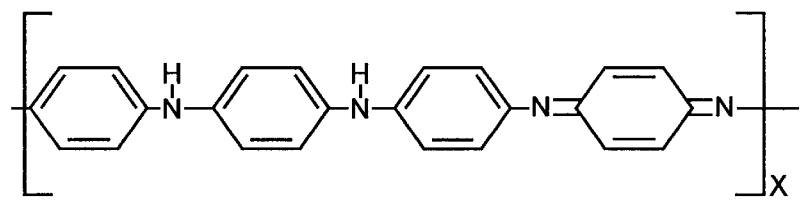

B) EMERALDINE BASE (HALF OXIDIZED MATERIAL)
[-($C_6H_4$) - N(H) - ($C_6H_4$) - N(H) -] - [-($C_6H_4$) = ($C_6H_4$) = N-]$_2$
CHARACTERISTIC VOLTAGE RANGE: 0 TO 0.65 VOLTS

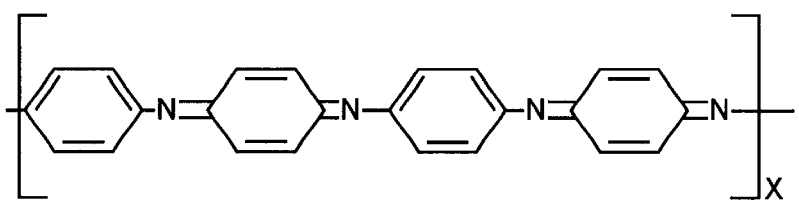

C) PERNIGRANILINE BASE (FULLY OXIDIZED MATERIAL)
[-($C_6H_4$) - N = ($C_6H_4$) = N-]
CHARACTERISTIC VOLTAGE RANGE: 0.65 TO 0.80 VOLTS

FIGURE 4A

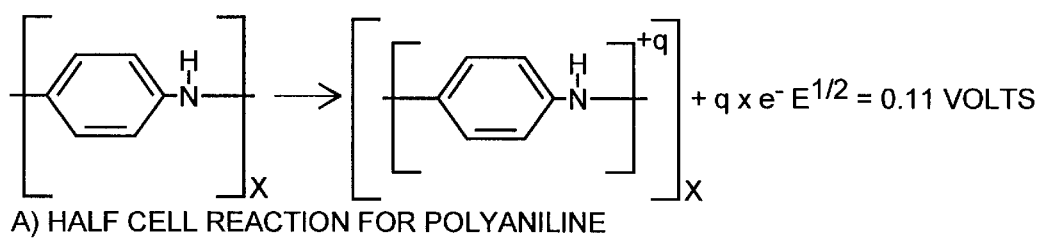

A) HALF CELL REACTION FOR POLYANILINE

FIGURE 4B

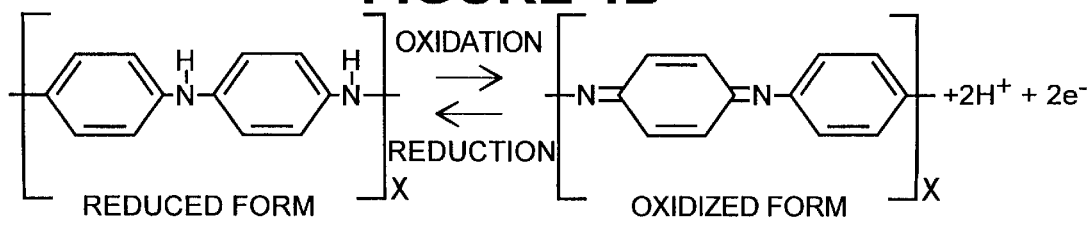

B) OXIDATION- REDUCTION FOR POLYANILINE

A) STRUCTURE OF RING-SUBSTITUTED, SULFONIC ACID-DOPED POLYANILINE

B) STRUCTURE OF NONPROTONATED, RING-SUBSTITUTED SODIUM SALT OF POLYANILINE

ELECTROCHEMICAL DEPOSITION OF A COMPOSITE POLYMER METAL OXIDE

BACKGROUND OF THE INVENTION

This invention relates to the use and formation of composite films through electrodeposition and anodization techniques. More specifically, the invention relates to the electrochemical formation of polymer-metal oxide composite films utilizing an electrolyte which incorporates a conductive polymer.

A common anodizing process employs aluminum as a substrate. The aluminum anodizing process is most often used to produce decorative finishes, to increase the corrosion or wear resistance of the aluminum substrate, or to provide an adherent interface for subsequent coatings. In most cases, the anodic film requires supplementary processing after film formation to achieve these characteristics. Supplementary coating is carried out through various sealing processes and conversion coatings, which seal the porous structure of the as-anodized film to offer corrosion resistance, pigmentation, and/or to provide lubricity to enhance wear resistance.

When the anodic film is used as an adherent interface for subsequent coatings, its purpose is usually to join dissimilar metals. There has long been a need for a reliable means to chemically join dissimilar materials whose atomic structures and compositions render them chemically immiscible, such as metals, ceramics and polymers.

Coatings used to enable a ceramic-to-metal joinder typically possess constituents which are miscible with their deposant substrates. For ceramic-to-metal joining, these constituents are metal oxides and glass formers which wet and bond to the ceramic surface. These coatings also include additional immiscible constituents which, by virtue of their immiscibility, create a new surface on which the joining process can be performed. Known methods to provide these coatings, such as thick and thin film metallization techniques, form a composite interface between the faying surfaces which permits complete chemical bonding of dissimilar metals and materials. However, these methods have not permitted polymer-to-metal joinder employing a chemical bond.

Some of the most common polymer-metal bonds use adhesives. These bonds require neither miscibility nor the formation of intermediate phases. The strength of the resulting polymer-metal bond employing an adhesive normally hinges on the quality of the substrate surface preparation. This is because the adhesive, while uncured, will flow to fill the features of the surface morphology. In this fashion, a mechanical bond between the adhesive and the substrate surface has been formed. While some of the bond strength is derived from polar forces between the adhesive and the surface, these forces are relatively minor and do not contribute in any meaningful fashion to the overall integrity of the bond.

"Adhesiveless" polymer—metal bonds have also been developed in the electronics industry. These bonds provide the advantage of size reduction, as well as enabling increased flexibility of electrical connectors and circuits. Adhesiveless bonds may be achieved by "seeding" a chemically prepared polymer surface. The nature of the adhesiveless bond involves the binding of a noble metal salt to a functional ligand on the polymer surface, followed by reduction of the noble metal to a zero valence state. The surface becomes slightly conductive, which enables electroless metal deposition. The resulting metal surface can then be coated by way of electrodeposition. However, the seeded film is insufficiently conductive for direct use for electroplating. Thus, without the enhanced surface preparation necessary to enable electrodeposition, the adhesiveless bond forces are weak and peel strengths are low.

The typical failure mode for both adhesive and adhesiveless polymer-metal bonds is delamination or "peeling" of the adhesive or one of the faying surfaces from the mating interface. Failures occur due to insufficient or inadequate surface preparation, surface contamination, or the use of a misapplied, worn, outdated or otherwise deficient adhesive.

Surface preparation for polymer—metal bonding ranges from simple surface cleaning to the development of a supplementary conversion coating on the metal surface. For steel bases, phosphate-type conversion coatings are most commonly utilized. For aluminum bases, the surface is often anodized. If properly deposited, the nature of the conversion coating or anodic film is that of a metal phosphate layer or a metal oxide layer chemically bound to the metal substrate. However, such coatings act only as a surface enhancer to promote adhesion for the polymer attachment. In other words, the conversion coating/anodic film acts as a primer and, while chemically bound to the metal substrate, it is not chemically bound to the subsequent polymer coating.

Anodic coatings used as "stand-alone" films, deposited for corrosion and wear resistance or for decorative purposes, but not to provide a dissimilar material joinder, have been created using a two-step process in which a polymer or other material is applied to the anodic film surface after anodizing has occurred. With polymer-based supplementary coatings, the polymer is not chemically bound to the oxide film and is of a thickness limited by the following factors: the effective mechanical adhesion properties of the film to the oxide; the diameter of the pores in the oxide film; surface wetting characteristics of the oxide; and the viscosity of the polymer coating. Because the supplementary coating is of a finite thickness that does not fully intrude the porous structure, it can chip and wear away from the substrate surface during service and, therefore, has a limited useful life. In another process, known as the "Metalast" process and disclosed in U.S. Pat. No. 5,132,003 to Mitani, an acrylate polymer is electropolymerized following hard coat anodizing. However, in this process, the acrylate polymer does not actively participate in the anodizing reaction, and requires a subsequent treatment from a second electrolyte bath which incorporates a metal salt, forming a finished composite coating in three steps. Other supplementary coatings, placed to impart corrosion resistance, involve conversion of the oxide into a metal complex, the most common being chromate conversion coating. As deposited, these coatings are gelatinous and therefore fragile. With dehydration, the supplementary coating becomes more durable but the useful life of the coating is limited by the coating thickness and by the amount of abrasion the component experiences during service.

In two publications, Huang, W. S. et. al., Polyaniline, A Novel Conducting Polymer—Morphology and Chemistry of its Oxidation and Reduction in Aqueous Electrolytes, Journal of the Chemical Society, Faraday Transactions I, 92: 2385–2400 (1986), and Chiang J. C. et. al., 'Polyaniline': Protonic Acid Doping of the Emeraldine Form to the Metallic Regime, Synthetic Metals, 13: 193–205 (1986), it is described how polyaniline can be transformed from the insulative to the conductive regime by doping the polymer with protonic acids. In this fashion, an already-polymerized film of polyaniline can be electrochemically or chemically doped to yield a conductive surface for subsequent processing. The reaction is reversible; therefore, by changing the external exposure parameters, one can dope to make the polyaniline conductive and "de-dope" to make it insulating. The doping processes involve an oxidative polymerization reaction where the protonic acid is bound to the polymer backbone through ring sulfonation, "de-doping" is a reduction reaction, as shown in FIG. 1.

The use of electropolymerized polyaniline as a surface conductive layer has been studied. Electropolymerization has been shown to occur on already-formed polyaniline films as well as in an electrodeposition reaction from electrolytes which contain aniline monomers in solution with protonic acids.

V. P. Parkhutik et. al., "Deposition of Polyaniline Films onto Porous Silicon Layers", Journal of the Electrochemical Society, Vol. 140, No. 6 (June, 1993), describe a process by which thin layers of conductive polyaniline are electrodeposited from sulfuric acid solutions onto already anodized porous silicon layers, developed at 2.0 A/dm$^2$ with pore diameters of about 4 nm. This publication indicates that the films developed on the anodized silicon cathodes exhibited good adhesion, acid resistance and infrared structures typical for the conductive emeraldine oxidation state of polyaniline. A polymerization potential of +0.6 to +1.0 v. SCE is also described. However, no actual silicon-polyaniline bond is documented. Also, the Parkhutik et. al. study, as well as U.S. Pat. No. 4,943,892 to Tsuchiya, for example, disclose a 2-step (anodization, followed by electropolymerization) process. In these references, electropolymerization is carried out by dipping the already anodized workpiece into a solution containing the appropriate concentration of protonic acid and aniline monomer and initiating the polymerization reaction at the workpiece surface by applying the characteristic voltage for the desired oxidation state of polyaniline, or by cycling the workpiece, as prepared for electropolymerization, through a series of voltages characteristic for the various phases of polyaniline. In these studies, the resultant polymer film, as deposited, exhibited the characteristics of the conductive emeraldine phase of polyaniline. Additional United States patents which describe this or a similar process with various applications are: U.S. Pat. No. 4,769,115 (Masaharu); U.S. Pat. No. 5,422,194 (Masaharu); U.S. Pat. No. 5,556,518 (Kinlen); and U.S. Pat. No. 5,567,209 (Kobayashi).

Researchers would have been dissuaded by the use of an aluminum-polyaniline reaction to form an anodized coating because the standard aluminum anodizing potentials exceed the published polymerization potentials for polyaniline. This raises the concern that the polyaniline molecule will degrade during anodization. Degradation is thought to occur by way of cleaving the carbon-nitrogen or carbon-hydrogen bonds of the monomer within the electrolyte during anodizing. More specifically, there is a concern that polyaniline can degrade to hydroquinone at potentials above 0.8 volts and, therefore, might have no impact or meaningful interaction with the anodic film.

Thus, electropolymerization and utilization of the polymer film as a surface conductive layer has been studied. Other publications describe utilizing the conductive layer as a precursor for subsequent metal electrodeposition. See, e.g., Angelopoulos, et. al., Conducting Polyanilines: Applications in Computer Manufacturing, Proceedings of the SPE 49$^{th}$ Annual Technical Conference & Exhibits, 765–769 (1991), incorporated by reference. However, none describe the formation of a composite metal oxide-polymer film through anodization of the metal with the polymer deposited simultaneously from a polymer solution within the electrolyte.

It would, therefore, be advantageous to provide an anodized coating which essentially eliminates the use of an adhesive attachment for subsequent polymer coatings. It would also be desirable to provide a self-sealing, stand-alone, chemically-bound polymer-to-metal coating in a single step, which would yield substantial time and material savings while providing an industrially viable process. Particular utility would also be found in the use of a stand-alone polymer-metal oxide composite coating chemically bound to a metallic substrate achieved through a standard anodization process; since the polymer phase would be completely and homogeneously integrated within the metal oxide, such a coating would provide superior wear and corrosion resistance.

BRIEF DESCRIPTION OF THE DRAWINGS

The novel features of the invention are set forth in the appended claims. However, the preferred embodiments of the invention, together with its further objects and attendant advantages, will be best understood by reference to the following description taken in conjunction with the accompanying drawings in which:

FIG. 3 shows the names, chemical compositions, approximate structures and characteristic voltages for the various oxidation states (phases) of polyaniline;

FIG. 4a shows the half cell reaction for polyaniline;

FIG. 4b shows the oxidation reduction reaction for polyaniline;

SUMMARY OF THE INVENTION

Figure 1:
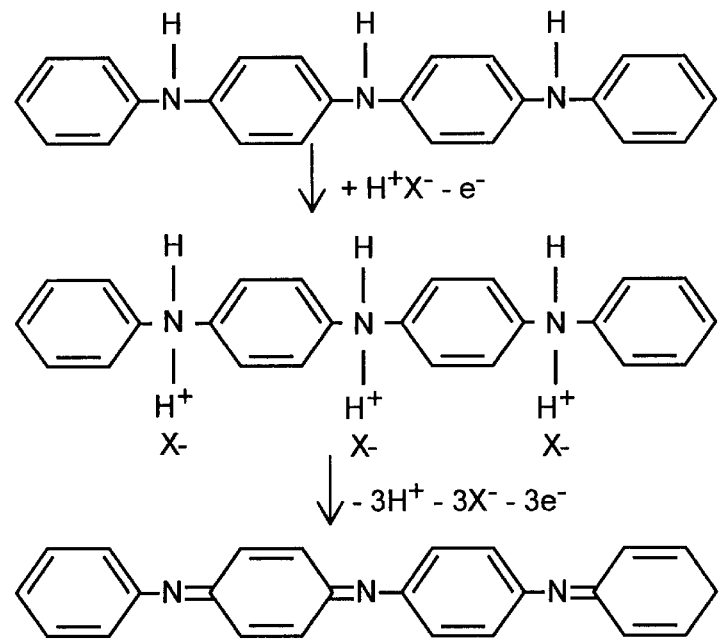
FIG. 1 shows the basic doping and dedoping reactions of polyaniline.

The present invention preserves the advantages of known coatings and processes for forming coatings that provide wear and corrosion resistance as well as a primer finish for polymer-metal bonding, and sealed finishes. It also provides new advantages and overcomes disadvantages associated with such coatings.

An anodic coating process for aluminum and aluminum alloy substrates has been theorized and experimentally proven which enables the formation of composite polymer-aluminum oxide films. An important step in this process is the modification of the sulfuric acid electrolyte by the addition of aniline monomer which polymerizes to polyaniline in situ. The polymer may be made electroactive (i.e., conductive) through ring substitution on the amino-benzene structure in a protonic acid. The protonic acid in this process is the sulfuric acid electrolyte.

Since anodization and polymerization are both oxidative, experimentation was performed to verify they would occur simultaneously. This process is referred to here as "codeposition". The experiments successfully resulted in uniform and continuous films which were consistently formed, as described below.

Scientific characterization determined that the polyaniline was deposited as the aluminum oxide film formed and grew from the substrate surface. A nonprotonated, ring-sulfonated aluminum salt of polyaniline was determined to be the reaction product throughout the anodic film. Additional polyaniline as polymer was also identified as being deposited at the surface of the films. These results determined the codeposition process yields completely chemically and metallurgically bound, fully integrated composite films in one step. Engineering characterization determined the codeposited films exhibited comparable corrosion resistance and superior wear resistance to conventionally anodized films processed through two steps.

In addition to the use of the composite anodic film as a transition layer to facilitate the bonding of dissimilar materials, the film produced through the codeposition process of the present invention may also serve as a "stand-alone" finish which exhibits comparable corrosion resistance and superior wear resistant to sealed metal oxide layers produced by conventional anodization or electroplating techniques. The resultant coatings may also function as a primer finish for polymer-metal bonding.

In a preferred embodiment of the present invention, an anodization process for forming a composite film on a metallic substrate is provided. The metallic substrate is anodized simultaneously with the deposition of a polymer or polymer phase from an electrolyte. The electrolyte incorporates a conductive polymer within a protonic acid solution.

In another preferred embodiment of the present invention, an anodization process is provided for forming a metal oxide-polymer codeposited composite film on a metallic substrate. A conductive polymer or polymer phase is incorporated in a protonic acid solution within an electrolyte. The metallic substrate is anodized simultaneously with the codeposition of the conductive polymer or polymer phase within the metal oxide during formation of the metal oxide film on the substrate surface. A generally discrete polymer film may be electropolymerized onto the surface of the composite film to produce a completely sealed, conductive polymer film on the surface of the codeposited composite film. In one preferred embodiment, the electropolymerized polymer is one of the conducting oxide states of polyaniline, such as emeraldine, and the monomer addition to the electrolyte is aniline. In other preferred embodiments, the electrolyte is based in or includes a mixture of one or more of the following protonic acids: sulfuric acid; methyl sulfonic acid; chromic acid; oxalic acid; or phosphoric acid. In still another embodiments, the metallic substrate is selected from one or more of the following metals: aluminum; silicon; zinc; magnesium; or titanium. The resulting codeposited composite film may be used for a variety of wear-resistant or corrosion-resistant applications, may be formed over a standard anodic film, or may be formed with an electropolymerized film. In one preferred embodiment, the process of the present invention results in the formation of a nonprotonated ring-sulfonated aluminum salt of polyaniline as a reaction product within the pores of the composite film. Preferably, the aluminum oxide has a columnar Boehmitic structure.

DETAILED DESCRIPTION OF PREFERRED EMBODIMENTS

The present invention relates to compositions and processes employing the codeposition of a conductive polymer, such as polyaniline, during an anodizing or electropolymerization process to provide a direct polymer-to-metal chemical bond. The term "codeposited" as used here means the growth of a metal oxide film, such as obtained on aluminum through anodization, while simultaneously depositing a conductive polymer within the film structure. The composite film can function as a transition layer to facilitate the bonding of dissimilar materials, as well as serve as a "stand-alone" finish which exhibits comparable corrosion resistance and superior wear resistance to sealed metal oxide layers produced by conventional anodization or electroplating techniques.

Thus, the present invention overcomes the limitations of polymer-to-metal bonding by creating a chemically bound interfacial layer. This interfacial layer has two phases: a metal oxide phase, and a polymer phase. The bi-phase interfacial layer provides a chemical link between the metal substrate and subsequent polymer coatings. A true metallurgical bond exists between the substrate and the metal oxide, while a chemical bond exists within the composite film between the oxide and the polymer. The presence of chemically bound polyaniline within the film allows for interdiffusion between the film and subsequent polymer coatings, creating a completely bound composite structure. This structure also offers enhanced engineering properties (corrosion and wear resistance) as a stand-alone film.

In a preferred embodiment, it has been determined that an aluminum oxide-polyaniline composite film offers a reactive surface allowing chemical interaction with subsequent polymer attachments. The polymer-composite film bond offers the advantage of a chemical rather than a mechanical bond for subsequent polymer coatings. This chemical bond should exhibit superior bond strengths to currently available adhesive bonds. When used as a stand-alone film, the electrochemical nature of the polyaniline within the electrolyte yields a dense, fully sealed, anodic film structure.

Figure 2:
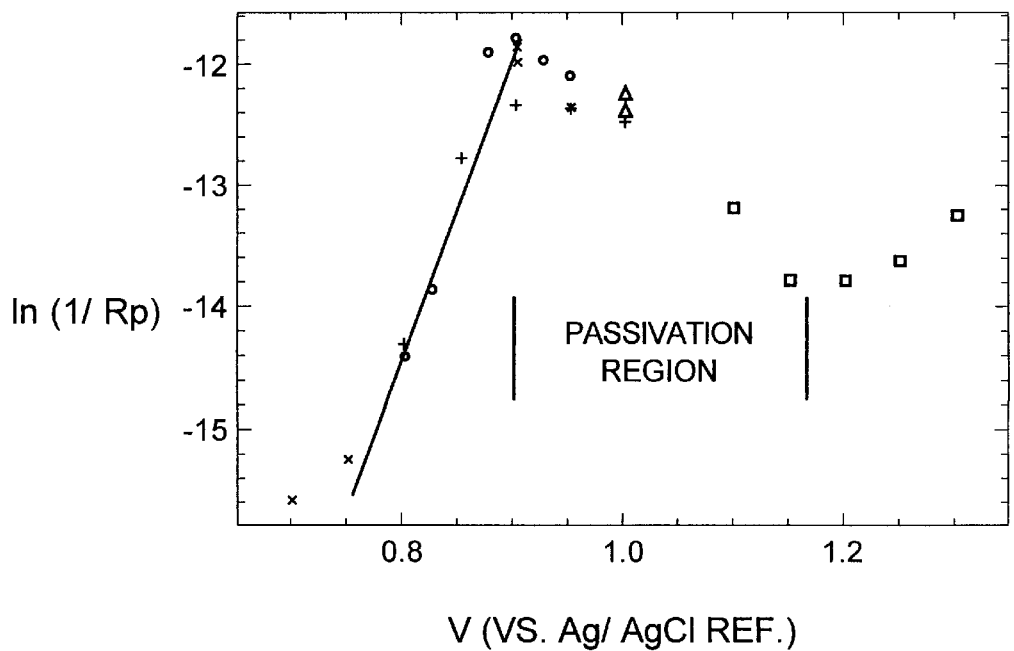
FIG. 2 is a representative Tafel plot for polyaniline.

The feasibility of the process is based on the electrical conductivity of polyaniline in solution upon substitution with protonic acids. Polyaniline films can also be doped by exposing them to protonic acid solutions. Polyaniline can be oxidized to a metallic state through doping. The resultant acid-base chemistry within the polymer system can be externally changed by either an electrochemical or a chemical method. Clearly, because the doping mechanism involves protonic acids (loss of a proton, specifically H+), the reaction is pH dependent. Johnson, B. J., Park, S. M., Electrochemistry of Conductive Polymer XIX, Oxidation of Aniline at Bare and Poylaniline—Modified Platinum Electrodes Studied by Electrochemical Impedance Spectroscopy, Journal of the Electrochemical Society, 143, No. 4, 1269–1276 (1996), incorporated by reference herein, utilized impedance measurements to construct a linear Tafel representation for aniline oxidation polymerization on the logarithmic scale (see FIG. 2). These reaction characteristics are necessary for electrodeposition reactions. Therefore, it was hypothesized that coating formulations might be developed by the addition of aniline monomer, based on conventional anodizing chemistry, that might yield unique films which incorporate polyaniline into the metal oxide film.

Conducting Polyaniline

Conducting polymers are highly conjugated systems which can be converted from the insulating or semiconducting regime to the metallic regime through chemical or electrochemical doping. Polyaniline (polyamino benzene) refers to a class of conducting polymers with different oxidation and, therefore, p-type conducting states. This material undergoes an insulator-to-metal transition upon doping with protonic acids in an acid/base type reaction. The conductivity of the polyaniline materials is a function of both the degree of oxidation and the degree of protonation.

The conducting polymers exhibit a potential window within which they are conducting. Thus, the polymer will be nonconducting (completely reduced) when the potential is too low, and will decompose when the potential is too high. Studies have shown that the conductivity is not only limited to a certain potential range but also to a certain pH range. The lower the pH, the more doping and/or ring substitution that occurs. A linear representation on the logarithmic scale was demonstrated between applied potential and current response during aniline polymerization. These characteristics indicate the material exhibits Tafel behavior, an electrochemical characteristic necessary for electrodeposition. For polyaniline, there are three main forms that correspond to the different oxidation states which occur within this conducting window. The approximate chemical compositions with their corresponding names and structures are shown in FIG. 3.

Some or all of the —N=groups can be protonated by aqueous acids to yield a range of corresponding salts, some of which are highly conducting. The most highly conducting form of polyaniline is the emeraldine salt. The acid-oxidation state equilibria of the various states of polyaniline can be changed externally by either an electrochemical or a chemical method. The oxidation-reduction reaction for polyaniline and a half-cell potential corresponding to the oxidation-reduction reaction for polyaniline are shown in FIG. 4. For this reaction, the half cell potential is the average of the anodic and cathodic peak potentials obtained from reported cyclic voltammetric studies (see, e.g., W. S. Huang, B. D. Humphrey and A. G. MacDiarmid, "Polyaniline, A Novel Conducting Polymer—Morphology and Chemistry of its Oxidation and Reduction in Aqueous Electrolytes," Journal of the Chemical Society, Faraday Transactions 1, vol. 82, pp. 2385–2400 (1986), incorporated by reference herein). Therefore, predictions as to the electroplating capability of an electrolyte solution containing polyaniline are possible.

Figure 5A:
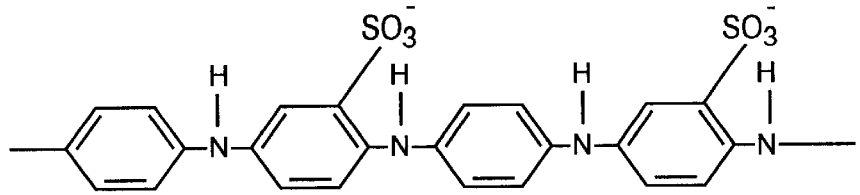
FIG. 5a shows the structure of ring-substituted sulfonic acid-doped polyaniline.
Figure 5B:
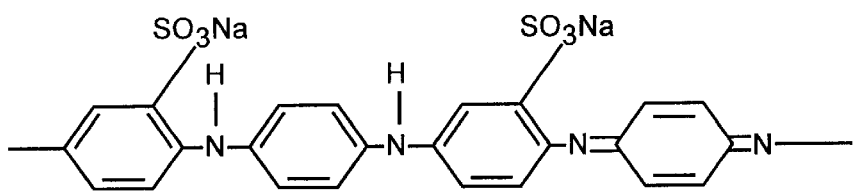
FIG. 5b shows the structure of the nonprotonated, ring-substituted sodium salt of polyaniline.

The formulation of an electrolyte with acid soluble aniline monomer is based upon the fact that the emeraldine base oxidation state can be converted from an insulator to a conductor by external protonic doping. J. Yue et.al., "Effect Of Sulfonic Acid Group On Polyaniline Backbone", Journal of the American Chemical Society, Vol. 113 (1991), incorporated herein by reference, discusses a doping method which involves the introduction of an acid group on the polymer chain to convert the polymer into a self-doped conducting polymer. Yue's study, perhaps familiar to polymer chemists but probably not to those acquainted with only anodizing techniques, specifically addresses the effect of sulfonic acid groups on the polyaniline chain and notes the compatibility and stability of the Ring-Sulfonated sulfonic acid-doped polyaniline. Ring-Sulfonated, nonprotonated soduim and potassium salts were also synthesized by processes according to the present invention (see FIGS. 5a and 5b).

Maeda et. al., Electrochemical and Thermal Behavior of Polyaniline in Aqueous Solutions Containing $SO_4^{2-}$ Ions, Journal of the Electrochemical Society, 142, No. 7, 2261–2265 (1995), incorporated by reference herein, evaluated the electrochemical and thermal behavior of polyaniline in aqueous solutions containing $SO_4^{2-}$ ions to clarify the doping process which makes polyaniline electrochemically functional. Review of these studies suggested to the inventor that oxidative reactions that normally require a sulfuric acid-based electrolyte may be modified to reflect inclusion of the polymer in the reaction product, i.e., the coating. Since the aluminum anodizing reaction can be carried out in sulfuric acid and since the polymerization reaction for polyaniline is one of oxidative polymerization, it was hypothesized that polyaniline might react with the aluminum substrate or within the aluminum oxide coating during anodization to form a chemically bound complex. Because aluminum is an active metal, similar to sodium and potassium, the inventor also hypothesized that the complex would be a nonprotonated, Ring-Sulfonated aluminum salt of polyaniline. Experimentation was performed to verify this conclusion, as explained below.

Anodizing Aluminum

Anodizing is the common designation for the electrochemical oxidation of certain metals to form stable oxide films on their surfaces. Films of various hardnesses and thicknesses can be produced to serve varying purposes by adjusting process parameters. Although there are a number of metals that can be anodized (specifically, the functional metals, which include titanium, tantalum, magnesium, beryllium and zinc), aluminum has the most commercial significance to date because of the unique nature of its anodic film. Most commonly, the aluminum anodizing process is utilized to produce decorative finishes, to increase the corrosion or abrasion resistance of the aluminum substrate, or to provide an adherent interface for subsequent coatings. Here, the parameters documented for producing corrosion and wear resistant films, as well as films providing an adherent interface for subsequent polymer coatings, are considered.

The nature of the anodizing process is based upon the electrochemical principle that when a current is passed through an electrolyte in which an aluminum anode is employed, the anion migrates to the anode. The anion is then discharged with a loss of one or more electrons. In an aqueous solution, the anion consists in part of oxygen, which is adsorbed by the aluminum surface. As chemisorption proceeds, the surface is reconstructed, forming a contiguous film of aluminum oxide as $Al_2O_3$. The resultant oxide film is slightly soluble in the electrolyte. The slightly soluble characteristic of the film causes localized dissolution. Pores are thus formed in the coating which are wide enough to allow continuous access of the current via the electrolyte to the metal. Anodic film growth continues and is gradually retarded as the film grows thicker and the electrical resistance increases. When the rate of film growth has decreased until it is equal to the rate of dissolution of the film in the electrolyte, the film thickness remains constant.

Figure 6:
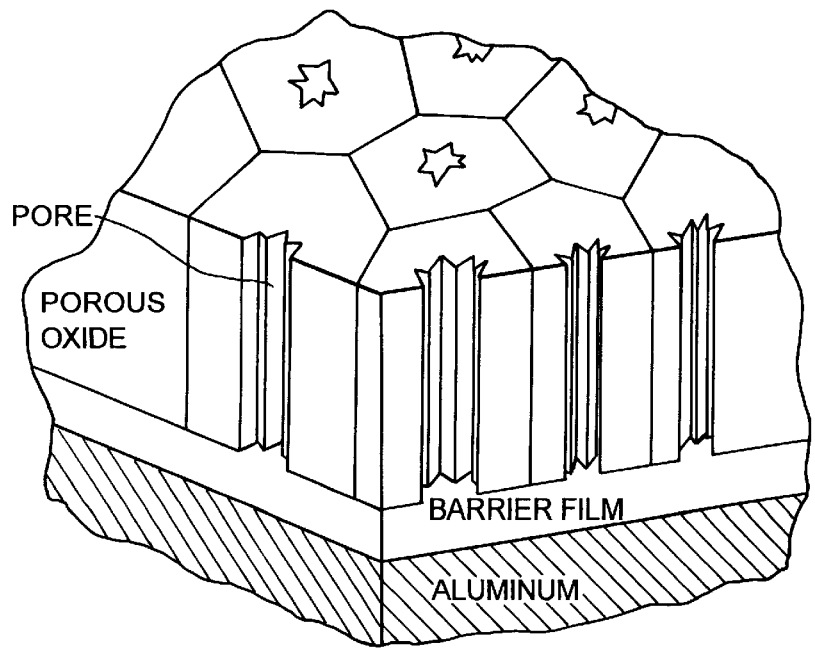
FIG. 6 is a schematic view of the columnar structure of the anodized polyaniline film on an aluminum substrate.

The resultant film is therefore dual-phase aluminum oxide. The dual structure consists of a thin, nonporous inner oxide layer adjacent to the substrate metal (also called the "barrier layer") and a thick porous outer oxide layer. The continuing anodizing reaction takes place from the aluminum substrate surface, i.e., from the aluminum—barrier layer interface. The film effectively grows from within; therefore, the adsorption/surface reconstruction reaction occurs continuously throughout the process, consuming the aluminum substrate. However, the outer part of the film is in contact with the electrolyte for the full anodizing time, and this interface develops into the second, outer phase. If the anodizing conditions favor film dissolution, this phase is porous $Al_2O_3$. The outer porous oxide has a columnar cell structure, as shown in FIG. 6.

Since the aluminum is being consumed to form the anodic film, the thickness of the substrate will therefore decrease. The oxide produced, however, is less dense and of a larger volume than the aluminum consumed; therefore, the component dimensions usually increase.

The microstructure, hardness and thickness of the layers depend upon the parameters of the anodizing process. These parameters include time, temperature, bath composition, and formation voltage. Anodizing electrolytes can be solutions of chromic acid, sulfuric acid, oxalic acid, phosphoric acid, boric acid, or mixtures thereof. While the focus of the experiments described here was on anodizing from electrolyte formulations based in sulfuric acid, it will be appreciated by those of ordinary skill in the art that other anodizing electrolyte solutions may be used (and are in fact used in current industrial applications).

Sulfuric acid solutions, 5–25% by volume, are the most widely used anodizing electrolytes. Anodic films utilized for subsequent coating applications are usually produced from a 10–15% sulfuric acid electrolyte. The bath is usually operated at temperatures of 20–25° C., a current density of 1.5 amps/dm$^2$, and a bath voltage of 10–25 V. The films produced range in thickness from 16–30 microns. Thicker, harder, and more porous coatings are produced by increasing the bath voltage and current density and decreasing the operating temperature; this is known as "hard coat anodizing". The chemical reaction which takes place at the surface of the aluminum anode can be written as follows:

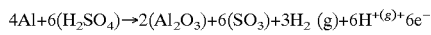

Figure 7:
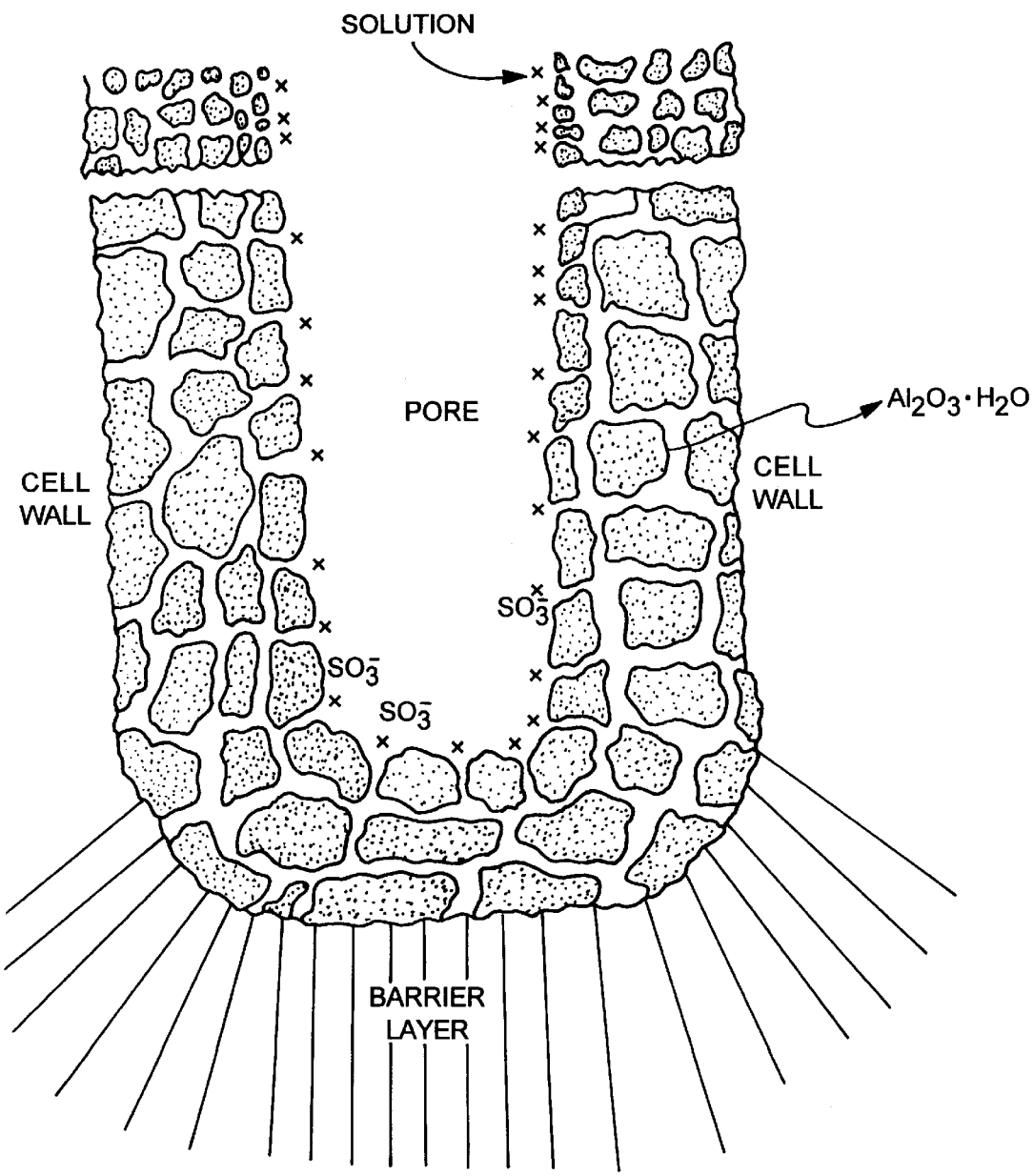
FIG. 7 is a schematic view of a a cross-section through a single pore of an anodic film.

S. Wemick et. al., The Surface Treatment and Finishing of Aluminum and its Alloys, Vol. 1, ASM International, Metals Park, Ohio (5th Ed. 1987), incorporated herein by reference, report the resultant film composition as: 72% $Al_2O_3$; 15% $H_2O$; and 13% $SO_3$.[31] The sulfate content of the normal sulfuric acid coating is between 13% and 17% but is higher at lower temperatures of operation and increases with current density. The constituents of the film composition can be accounted for as follows: the outer porous film is composed of partially hydrated alumina ($Al_2O_3H_2O$), and sulfate ion ($SO_3^-$), which is discharged at the base of the pores of the columnar structure of the outer film (see FIG. 7).

The inherent porous nature of the outer layer of the anodic film requires that the film be sealed to provide a protective coating. The mechanism of sealing is not fully understood but is thought to involve conversion of the amorphous oxide of the pores into alpha alumina monohydrate. This conversion is accompanied by a change in volume. The volume change is thought to seal the oxide film by "plugging" the pores so that the anodic film becomes impermeable and its protective capability for the substrate metal is enhanced. Various types of sealants have been developed to increase corrosion resistance, enable pigmentation, and/or to ensure good lubrication of wear surfaces.

A variety of polymer sealants based in polytetrafluoroethylene (PTFE) have been developed and tout abilities to intrude the pores of the anodic film structure. However, the large size of the PTFE polymer molecules relative to the pores in the anodic film (a minimum 50 nm for colloidal PTFE particles versus 4–20 nm pore diameters for anodized films), and the entropic effects of particles in solution (i.e., larger particles tend to attract each other), prohibit actual incorporation of the PTFE polymer sealants within the microstructure of the unsealed anodized film.

Deposition of Polyaniline Films onto Anodized Aluminum

It is the porous, acidic nature of the sulfuric acid anodized film which makes it particularly attractive for the development of a polyaniline metal interfacial bond. Because the same carrier (sulfuric acid) could be used with both anodization and electropolymerization processes, experimentation proceeded to verify that the reactions could occur simultaneously.

Polyaniline was deposited onto an anodized aluminum sheet by using an anodized aluminum substrate as a working electrode in an aniline—sulfuric acid electrolyte solution. The polymerization reaction was initiated at its surface by applying a voltage characteristic for the polymerization of the emeraldine salt phase of polyaniline. Attachment was facilitated not only by the crystallization and volume change of the anodized film sealing process, but also by the bonding of the polymer to the functional sulfonic acid ligands at the base of the pores of the outer layer of the anodized film. The resultant sealant is a film of sulfonic acid Ring-Sulfonated polyaniline chemically bound to the pores of the anodized structure. This reaction is more electropolymerization than actual electrodeposition; however, its function as a sealant of anodic films may prove significant.

Anodization proceeds at voltages that exceed the polymerization potentials for polyaniline. Therefore, in order to incorporate an ideal polymer phase, which retains the characteristics of the neat polymer, within or bound to the surface of the anodized film, the anodizing reaction must be stopped and parameters adjusted to those appropriate for electropolymerization of the subject polymer, similar to the approach used by Parkhutik on silicon.

It was hypothesized (and experimentally verified, as shown below) that electropolymerization could be accomplished with a sulfuric acid electrolyte formulation which incorporates aniline monomer by stopping the aluminum anodizing reaction after the desired film thickness is reached and proceeding in a potentiostatic mode at voltage characteristics for the desired phase of polyaniline. This enables direct deposition of a polymer film over the anodized aluminum film. Alternatively, direct deposition may occur over the surface of the codeposited film.

Figure 8:
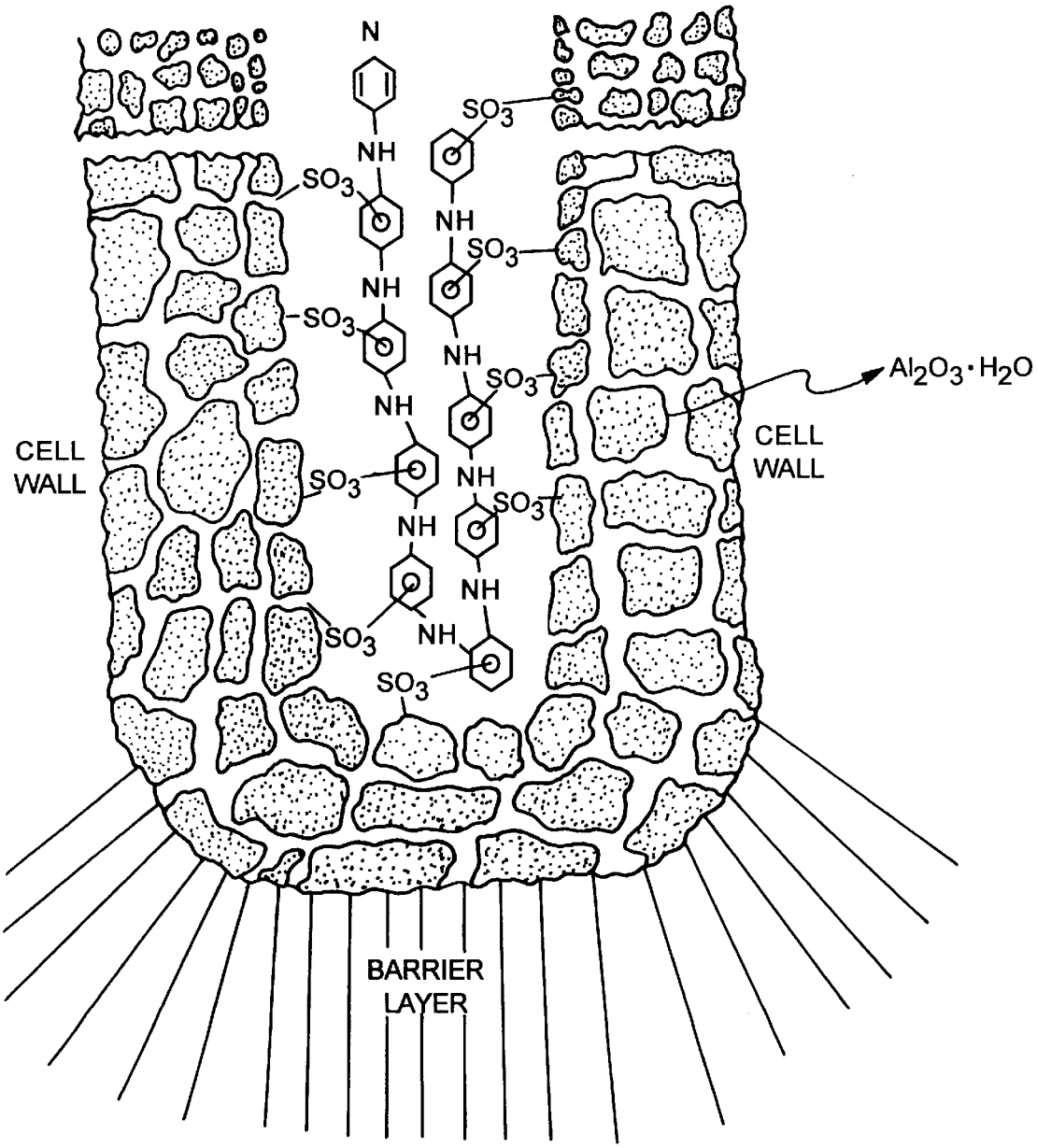
FIG. 8 is a schematic view of the structure on an anodic film electrochemically sealed with polyaniline in accordance with the present invention.

The proposed electropolymerization reaction is different from codeposition as it is a two-step process which yields thin coatings of "ideal" polyaniline over a preexisting anodized or codeposited film. However, its function as a sealing process for anodic films may prove commercially significant. It was hypothesized that attachment of the polyaniline to the anodic film would be facilitated not only by the crystallization and volume change of the anodized film sealing process, but also by the bonding of the polymer to the functional sulfonic acid ligands at the base of the pores of the outer layer of the anodized film, forming ring-sulfonated, nonprotonated aluminum salts of polyaniline within the structure. It was also theorized by the inventor that additional oxidative polymerization may proceed during the sealing reaction to yield a layer of protonated polymer whose phase could be identified through cyclic voltammetry. FIG. 8 illustrates the proposed structure for an anodic film sealed with polyaniline.

Simultaneous Aluminum Anodizing and Electrodeposition of Polyaniline

The similarities between the actual anodizing process and the electrodeposition of polyaniline onto various substrates suggested to the inventor the possibility of carrying out the reactions simultaneously, producing a composite metal oxide-polymer film. As with the proposed reaction for the electrochemical sealing with polyaniline, it was hypothesized that the polyaniline will deposit and react with aluminum oxide film. However, this reaction occurs as the aluminum oxide film forms and will continue to deposit and react as the oxide film grows. It is believed that some of the polyaniline in the electrolyte reacts during anodization to form the sulfonic acid Ring-Sulfonated polyaniline, and some of the polyaniline reacts during anodization to form a Ring-Sulfonated, nonprotonated aluminum salt of polyaniline. Two separate reactions are hypothesized and are presented below:

$$3[-(C_6H_4)-N(H)-]+2\ Al+3(H_2SO_4) \rightarrow 3[-(C_6H_4)-N(H)-SO_3]^-+Al_2O_3+6H^++6e^- \qquad (2)$$

$$3[-(C_6H_4)-N(H)-]+5Al+3(H_2SO_4)43\ 3[-(C_6H_4)-N(H)-SO_3Al-]+Al_2O_3+9H^++e^- \qquad (3)$$

Considering the values of the half cell reactions:

$$[-(C_6H_4)-N(H)-]x \rightarrow [-(C_6H_4)-N(H)^+]x+qxe^-\ E_o=0.11\ \text{volts vs. SCE}$$

$$Al^{3+}+3e^- \rightarrow Al\ E_o=-1.662\ \text{volts vs. SHE} \qquad (4)\ [16]$$

Converting the value of the half cell reaction of FIG. 4 to SHE, $E_o=0.131$ volts. The driving force for the electropolymerization/aluminum oxidation reaction may be considered the difference between the half cell reactions, with the equation from FIG. 4 as the cathode.

$$V=E° \text{ cathode}-E° \text{ anode} \qquad (5)$$

$$V=0.131\ \text{volts}-(-1.662\ \text{volts})$$

$$V=1.793\ \text{volts}$$

The positive value for the driving force of the reaction proposed as equation (2), above, indicates the reaction will proceed as written and the polyaniline will react with the aluminum(oxide) and sulfuric acid to form a metal oxide—sulfonated polyaniline composite. A reaction between the base aluminum and the aniline polymer is assured by Tafel behavior.

Further research and experimentation are required to determine actual electrode kinetic parameters for polyaniline in sulfuric acid with an aluminum anode. The positive value for the driving force of the reaction indicates the possibility of a rate-limiting step. The polymerization potential is hypothesized as that step. The maximum polymerization potential for polyaniline is its pernigraniline oxide state, which is 0.8 volts, and which can be controlled during a secondary sealing operation. Even if this fully oxidized state of the polymer is the electrodeposited phase, it is well documented that a phase shift can be obtained through cyclic voltametry back to the conductive emeraldine oxidation state. The characteristic of reversible polymerization is actually favorable as there may be applications for the composite film which may or may not require film conductivity.

The theoretical results, although suggesting that an aluminum-polyaniline reaction would occur, raised the concern that the polyaniline molecule would degrade during anodization. Degradation is thought to occur by way of oxidation of cleaved carbon-hydrogen bonds and the formation of carbon-oxygen double bonds characteristic of carbonyl groups present in hydroquinone. Therefore, if degradation occurred within the electrolyte, the inclusion of the monomer in the electrolyte might have no impact or meaningful interaction as an ideal polymer with the anodic film. Experimentation proceeded to determine what types of films could be formed through the proposed reactions to determine the impact inclusion of possibly degraded polymer might have on the anodic film microstructure.

The polymer-composite film bond should also offer enhanced engineering properties of adhesion, and corrosion and wear resistance as a stand-alone film. This is due to the electroactive nature of the aniline within the electrolyte, which allows for complete integration of the polymer within the metal oxide film during the anodizing reaction, yielding a dense, fully sealed, anodic film structure. It is also believed that the polyaniline complexes with aluminum sulfonic acid ligands within the porous structure of the aluminum oxide during anodization, forming chemical bonds within the composite film.

EXPERIMENTAL PROCEDURE TO DEVELOP ACTUAL COMPOSITE FILMS/SCIENTIFIC CHARACTERIZATION

Small Scale Laboratory Experimentation

Experimentation focused on the development of the composite films by actually anodizing aluminum anodes in sulfuric acid/aniline electrolyte. Sealing studies were conducted at the suitable polymerization potentials for the various oxidation states of polyaniline on the surface of anodized aluminum substrates. Analysis was done to characterize the resultant films and to determine their quality.

In the small-scale laboratory experiments, stock solutions of 2M $H_2SO_4$ were prepared for use as the anodizing electrolyte in a 600 ml. beaker. Standard anodization experiments were carried out galvanostatically at DC current values of 20 milliamps and 30 milliamps. The choice of current densities was based in the original silicon anodization study performed by Parkhutik and in the "Rule of 720". This simple formula is:

$$\frac{\text{current (amps)} \circledast \text{ time of exposure (minutes)}}{\text{(surface area to be coated (ft}^2) \circledast\ 720)} = \text{coating thickness}$$

(Coating thickness in thousandths of inches.)
The Rule of 720 can be used to determine the time of exposure for the anodizing reaction, given the desired film thickness and the appropriate current density for an anodizing reaction. This formula is commonly used throughout the anodizing industry and appears to be based in the Ilkovic equation utilizing the half cell potential for aluminum.

The working and counter electrodes for the analysis were 1 cm×3 cm coupons cut from 5657 aluminum sheet. The reference electrode was a calomel electrode with a cracked glass bead junction purchased from Fisher Scientific. The electrochemical measurements were made with an EG&G Princeton Applied Research Model 273 power supply with both potentiostatic and galvanostatic mode working capabilities. All anodization and codeposition experiments were performed in the galvanostatic mode. Electropolymerization was performed in the potentiostatic mode. Initial processing involved galvanostatic anodization of alloy 5657 aluminum sheet. This aluminum sheet exhibited a somewhat reflective finish with 2 molar $H_2SO_4$ at 20 milliamps for 1 hour (current density=0.66 amps/dm²). The visual appearance of the anodized films was of a satin finish.

Experiments proceeded with the addition of 0.05M aniline monomer to the 2 M sulfuric acid solution, after first anodizing with the sulfuric acid electrolyte alone for one (1) hour at a current density of 0.66 amps/dm². The resulting aniline—$H_2SO_4$ solution was then utilized to simultaneously anodize the aluminum and theoretically, deposit polyaniline into the Boehmitic structure, hence referred to as codeposition. Visual examination of the finished films determined they exhibited a similar appearing satin finish with comparable reflectivity to the as-anodized films, without the aniline monomer addition to the electrolyte.

The final set of small scale experiments proceeded with a 2M sulfuric acid/0.05M aniline electrolyte. Codeposition was performed for 1 hour at 20 milliamps (current density 0.66 amps/dm²). Visual assessment of the finished films determined a matte-satin finish with similar reflectivity to the as-anodized films, without the aniline monomer addition to the electrolyte.

Electropolymerization of polyaniline was attempted potentiostatically on conventionally prepared anodized films by making an addition of 0.05M aniline monomer to the 2M sulfuric acid after the anodizing reaction had been stopped. After the aniline addition was solubilized in the electrolyte, a polymerization potential of 0.6 volts, corresponding to the published polymerization potential of the emeraldine salt of polyaniline, was applied to the anodized electrode. The reaction was allowed to proceed for five (5) minutes. Visual assessment of the resultant film determined they exhibited a milky-white appearance. Experiments were repeated at the polymerization potentials for leucoemeraldine and pernigraniline, 0.4 volts and 0.8 volts respectively. Films formed at both voltages did not exhibit the same appearance as the electrode anodized and sealed with the aniline monomer in solution at 0.6 volts. They exhibited the same appearance as those anodized without the monomer in solution.

Experiments at Increased Scale

Experimentation continued by up-scaling the equipment used for the anodization process. A 20 liter tank was constructed from polypropylene. Aluminum alloy 6061 cathodes and copper bus bars were utilized. Small racks were also constructed from aluminum alloy 6061. The calibrated rectifier used to maintain current density/potential, manufactured by Rapid Electric Company, Inc., Brookfield, Conn., reference no. 97133A, was capable of a DC potential range of 1 to 15 volts and a DC current range of 0 to 15 amps. Electrolyte solutions of identical composition to those in the small scale experiments, using sulfuric acid and aniline monomer from identical sources, were utilized. Anodes, four inches by four inches square, were constructed of 5657 Aluminum alloy as well as from 6061 Aluminum alloy. Thickness and time of exposure calculations were performed following the "Rule of 720". Parameters were varied to reduce/increase time of exposure to yield different composite film thicknesses.

With the increased electrolyte bath size, it was impractical to make new solution with each anodization reaction. Therefore, experiments were carried out to determine the rate of consumption of the aniline monomer with each one hour long anodization reaction. High Pressure Liquid Chromatography (HPLC) was performed on samples of electrolyte solution following one (1), two (2) and three (3) sequential anodization experiments. The samples were analyzed by HPLC under the following conditions:

Column: C-18, 250×4.6 mm, 5 micron particles

Mobile Phase: 0.05M KH2PO4, pH3.2: Acetonitrile (60:40)

Flow rate: 1.0 ml/min

Detector: Photodiode array @ 254 nm

Due to the acidity of the samples, small injection volumes were used to allow the buffer in the mobile phase to maintain the correct pH. The injection volume for all samples was 1 microliter. Using the standard which was prepared in the laboratory, and the control sample of 0.05M aniline, the aniline concentrations for the three samples which had been used in the anodization experiments were calculated. The concentrations of aniline in the three samples are summarized in Table 1, below. The concentrations followed a trend downward as an additional anodization run was performed. An average consumption rate of 13% of the total monomer in solution with each anodization run of one (1) hour was determined.

TABLE 1

RATE OF ANILINE MONOMER CONSUMPTION FROM THE ANODIZING ELECTROLYTE

| Sample | 2.33 min. peak | 3.93 min. peak |
|---|---|---|
| Control | 0.05M | |
| 1 Run | 0.044M | 0.048M |
| 2 Runs | 0.038M | 0.043M |
| 3 Runs | 0.034M | 0.041M |

The results of the HPLC study determined that a monomer addition corresponding to 13% of the initial monomer addition equal to 0.05 M by volume was required to maintain the concentration for the coating to be consistently formed. Codeposition at higher monomer concentrations yielded more polymer in the finished films. Additional studies are required to determine the advantages of having more codeposited polymer in the anodic film.

Other than the required addition of the aniline monomer to maintain the 0.05M concentration, solution maintenance was performed as it would be for a standard anodizing bath. Total and free acid levels were routinely monitored as well as the aluminum content within the bath. Additions of deionized water were made to maintain the 2M acid concentration. In order to achieve a minimum aluminum concentration of 3 grams per liter, one (1) liter of preexisting anodizing electrolyte from an anodizing line maintained at 8 to 12 grams per liter was introduced to the anodizing electrolyte each time a fresh solution was made.

A black-appearing particulate film was observed on the surface of the cathodes with subsequent sequential anodization experiments. Fourier Transform Infrared (FT-IR) analysis of the film was performed to establish its nature. FT-IR enables the identification of organic compounds through obtaining characteristic infrared absorbances, displaying them as spectra and comparing them to a library of standards. Samples of the film were collected and prepared for analysis by rinsing them with deionized water to remove any aluminum complexes that had formed on the surface of the cathodes during anodizing. FT-IR of the particles that comprised the films determined two phases of polyaniline were present. One particulate phase exhibited a distinct green color and spectrum for polyaniline. It was concluded that, based upon the color, the phase was emeraldine, the highly conductive phase of polyaniline. The black particles exhibited a degraded spectrum; however, benzene ring structures were displayed within the obtained spectra for the samples collected which suggested it was comprised of a polyaniline (aniline) phase.

It was noted that the presence of the polymer film formation on the cathode surfaces decreased the efficiency of the anodizing reaction as the bulk of the film formed was insulating and increased the resistance of the reaction into the electrolyte. Therefore, the cathodes were cleaned of the film between anodization runs by wiping them down and rinsing them in water.

Similar voltage-current response was noted for the large scale experiments as in the small scale laboratory experiments. The coatings developed exhibited the same visual appearance. These results determined the stability of the reaction with increased size and indicate the process has industrial applications.

Scientific Characterization of the Composite Films

The nature and quality of the films were established through scientific and engineering characterization studies.

Scientific characterization proceeded by way of the following methods: visual and macroscopic examination, metallographic (microstructural) analysis, Scanning Electron Microscopy with Energy Dispersive X-ray Analysis (SEM/EDS), Transmission Electron Microscopy with Electron Energy Loss Spectroscopy (TEM/EELS), Fourier Transform Infrared (FT-IR) spectroscopy, Cyclic Voltammetry (CV) and Electron Microprobe Analysis (EPMA) with Wavelength Dispersive Analysis (WDS). These methods were used to characterize the chemical and metallurgical nature of the films, as described here.

As discussed above, the finished composite films exhibited a satin finish with reflectivity comparable to as-anodized films, without the monomer addition to the electrolyte. Discernment between films anodized with the monomer addition and those without was done visually by observing the drying patterns of the films upon removal of the anodes from the electrolyte and rinsing them in clear, running water. Coatings that had been formed in the electrolyte containing the monomer addition exhibited a white halo at the wetting meniscus as drying proceeded. The white halo disappeared when drying was complete. The conventionally anodized films did not exhibit the white halo. The presence of the halo was attributed to the inclusion of the polymer phase within the metal oxide film.

FT-IR analysis of the finished codeposited films determined that a phase of polyaniline polymer was indeed included within the aluminum oxide film. Additional experimentation proceeded by way of cyclic voltammetry (CV) to identify the exact phase deposited. Anodization was performed with platinum electrodes following the same procedures documented in the previous chapter. Because platinum is a noble metal and not subject to the oxidation reactions displayed by aluminum and the other functional metals, CV could proceed on the deposit of the surface of the platinum anode without the interference of the metal oxide on the polymer. This enabled identification of the polymer phase deposited utilizing the reaction parameters of the codeposition. A tenacious, coherent green-black film was obtained on the surface of the anode through the anodizing parameters used for the codeposition reaction. This was surprising, as the polymer phase obtained during codeposition with the aluminum anode appeared translucent both on finished diodes and while the anodes were wet. This indicated a reaction was indeed occuring between the aluminum and the polyaniline.

Following the anodization experiment on the platinum electrode, the EG&G Princeton Applied Research Model 273 power supply described previously was set at a scan rate of 50 mV per second over the voltages characteristic for the various phases (oxide states) for polyaniline (0 volts to 1 volt). As scanning proceeded from 0.4 volts to 0.8 volts, changes were noted in the film appearance indicating that because of the well documented phase reversibility of polyaniline, the oxide phase of polyaniline deposited during anodization at the parameters selected is emeraldine. The results determined voltammetric behavior typical for polyaniline with open circuit potentials within the emeraldine regime (value=+0.5 volts). In fact, an additional peak was noted on the voltammogram, from approximately 0.77 volts to 1.0 volts, which is characteristic for polyaniline degraded by high voltage exposure, FT-1R determined the green-black phase was indeed polyaniline. Upon comparison to the spectrum obtained from the codeposited film, a good match was determined, confirming polyaniline was reacting with the aluminum oxide (anodized) film as it was being deposited.

Surface examination of anodized films formed by the described experimental parameters within the SEM disclosed the surface structure typical for a porous aluminum oxide (Boehmite) film. Metallographic preparation and examination with a calibrated metallurgical microscope with magnification capabilities to 2000× determined the films developed were uniform and continuous, and measured approximately 0.2 mils thick, which corresponded to the thickness calculation by the "Rule of 720". The microstructure was typical for a conventional anodized film: a thin barrier layer with a columnar Boehmitic aluminum oxide structure. This was disclosed both through metallographic examination and through SEM/EDS.

Experiments then proceeded with the addition of 0.05 M aniline monomer to the 2M sulfuric acid solution, after first anodizing with the sulfuric acid electrolyte alone for one (1) hour (current density=0.66 ampsldm$^2$). Visual assessment determined the films exhibited a similar satin finish with comparable reflectivity to the as-anodized films, without the aniline monomer addition to the electrolyte. SEM analysis of films developed in this manner exhibited distinct surface phase formation. It was apparent that the porous structure of the Boehmite had been dilated with the introduction of the aniline monomer to the electrolyte. Pore dilation strongly supported the theoretical results that the aniline monomer would react with the aluminum during the anodization reaction.

Metallographic preparation and analysis of these films determined they were uniform and continuous and measured slightly thicker than 0.2 mils. They also exhibited distinct duplex phase formation. Transition in the film microstructure from a conventional columnar anodic film ($Al_2O_3$) to a more fine-grained, apparently denser microstructure with an amorphous—appearing white polymer phase was noted through metallographic examination and SEM examination. These results indicated the reaction changed immediately with the addition of the aniline monomer to the electrolyte. More importantly, the results indicated that polyaniline was deposited into the preexisting anodized layer as additional aluminum oxidation reaction (anodization) proceeded.

Electron probe microanalysis (EPMA) noted distinct elemental segregation corresponded to the phase transition. Only the elements typical for a standard anodized film were observed directly adjacent to the aluminum substrate (aluminum, sulfur and oxygen). The top portion of the film exhibited pore dilation, yet a finer-grained, denser microstructure with the inclusion of the amorphous phase; it also exhibited the inclusion of nitrogen with the standard elements of the anodic film, indicating the polymeric-appearing phase intruded the $Al_2O_3$ columnar structure.

SEM examination of the surface of totally codeposited films revealed that the aniline addition which had apparently dilated the columns of the Boehmitic structure of the duplex film had grown over the top of the oxide structure, forming a contiguous surface coating. Metallographic preparation and analysis determined the anodizing process yielded uniform and continuous films that measured 0.4 mils thick. SEM examination determined the films had retained the columnar Boehmitic structure but exhibited the fine, dense microstructure similar to the top portion of the duplex film. The top surface of the film exhibited apparent overflow of the polymer phase, forming a polymer surface film. EPMA determined the film was entirely impregnated with nitrogen, indicating the total integration of what appeared to be a polymer phase with the anodized aluminum oxide film.

Comparative examination of the metallographic cross-sections of the duplex and totally codeposited films to conventionally anodized films at the same electrochemical parameters revealed a distinct increase in thickness with the addition of the aniline monomer to the sulfuric acid electrolyte. The increased thickness of the coatings deposited from electrolytes with the aniline addition, together with the information derived from CV that the anodizing parameters do not degrade the polyaniline (in fact, when deposited on platinum, the emeraldine oxidation state is obtained), as well as the knowledge that the polyaniline is reacting with the aluminum to form a white-colored reaction product which dilates the pores of the Boehmitic structure, strongly suggests that the reaction product is simply taking up more space within the oxide film. In other words, while the oxide film itself may be less dense (pores are bigger), the space is being taken up by the polyaniline-aluminum salt and possibly by electro-polymerized polyaniline. Another possible contributing factor to the increased thickness is that due to the high concentration of sulfuric acid within the electrolyte, the level of sulfonic acid substitution on the benzene rings of the aniline monomer in solution is also very high. While this might break up the conjugated structure of the polyaniline, reducing the lengths of the polymer chain in solution, it will not change the conductivity of the solution. Even with the change in structural confirmation, the individual Ring-Sulfonated molecules will retain isolated electron movement, and will move in the direction of the imposed potential. Therefore, it may be that oxide film formation with finer microstructure proceeds with the deposition of the apparently degraded polymer not only because the smaller polymer chains offer more individual bonding sites for ring-sulfonated Polyaniline-aluminum attachment, but also because of the stability of the polymer in the electrolyte and the fact that the conductivity and electroactivity of the solution is maintained throughout the coating process. This latter theory is supported by the CV results which determined the characteristic peak for polyaniline degraded due to high voltage exposure.

The polyaniline-aluminum compound formed within the composite layer during codeposition exhibited a white color when wet and appeared translucent when dry. No white-translucent phase was developed through codeposition of the platinum electrodes. However, following the experimental procedure described above, in a 2 M sulfuric acid with 0.05 M aniline electrolyte saturated with aluminum sulfate, a film was produced which exhibited an FT-IR spectrum most similar to that of the codeposited films. The spectrum exhibited a downward shift with absorbance bands broadening in the area of the spectrum characteristic for Aluminum Sulfate. These results indicate, together with the supporting data, that the compound formed is a ring-sulfonated, nonprotonated aluminum polyaniline polymer salt.

Polyaniline degradation in solution was also disclosed during the HPLC analyses performed to determine the rate of monomer consumption during codeposition. A distinct broadening or shoulder was observed to have formed on the 2.33 min. peak, suggesting a monomer reaction was occurring within the electrolyte. It is hypothesized that the reaction is one of spontaneous oxidative polymerization. In other words, polymer chains are forming in solution. Based upon the previous theory, they must be short, and could possibly be charged agglomerates or networks of the small chains of polyaniline. Gel Permeation Chromatography (GPC) studies have shown this phenomenon does occur in solutions of polyaniline. The term "degradation" is therefore relative, as the characteristics of the polymer derived by the codeposition process appear to be favorable and have substantial engineering applications.

Finally, metallographic and SEM analysis of films formed by way of electropolymerization at potentials characteristic for the emeraldine phase of polyaniline, after the electrodes were oxidized following standard anodization procedures, determined the oxide film had significantly degraded during the electropolymerization reaction. While the columnar Boehmitic character of the films was retained, the columnar spacing was detrimentally increased, evidently through chemical attack. However, it was noted that the polymer film lined and coated the columns as well as the surface, where it remained coherent. While these experimental results did not yield quality films, they show that with additional experimentation with process parameters (i.e., reduced time of exposure and/or reduced acid concentration of the electropolymerization electrolyte), a successful ideal polymer seal can be developed. The development of successful electropolymerization over the codeposited films will prove important in the formation of surface conductive polymer-metal oxide composite films.

Engineering Characterization

After composite films were formed on aluminum anodes as described above, they were subjected to various forms of testing to determine both their quality and the possibility of practical application. Testing was performed to determine adhesion and flexibility, wear resistance, and corrosion resistance. In addition, measurements to determine surface insulation resistance were taken and surface reflectivity testing was performed. Surface reflectivity testing was done on 5657 anodes coated through the codeposition process at various thicknesses, specifically to assess viability of the coating in the aluminum coil anodizing industry (where the finished product is used as reflectors in overhead lighting applications). The results of these tests, discussed below, were used to indicate the viability of various applications for the composite film.

Surface conductivity (sheet resistance) of codeposited films as-anodized was determined with a four point probe and a Simpson micro-ohm meter with a sensitivity range of 20 milli-ohms to 20 ohms. All films formed by the codeposition process were determined to be nonconductive. This supports the theory that networks of sulfonated polymer, whose conjugation is interrupted by a change in confirmation due to the level of substitution within the electrolyte, are deposited as the aluminum oxide film forms on the substrate. It also indicates the formation of a nonprotonated Ring-Sulfonated aluminum salt of polyaniline is the reaction product formed between the aluminum oxide and the polyaniline.

Coating adhesion was evaluated per ASTM B571 "Test Methods for Determining Adhesion of Metallic Coatings". (See, specifically, paragraphs 8 and 13, referencing the "grind/saw" and "scribe grid" tests, respectively). None of the samples exhibited chipping, flaking or delamination, demonstrating the excellent adhesion of the codeposited composite films.

Corrosion resistance of the coatings was evaluated per ASTM B117 "Practice for Operating Salt Spray (Fog) Apparatus". Samples were exposed to 24, 48 and 96 hours of salt spray. The samples were compared to standard anodic films which had been sealed with nickel acetate. The samples exhibited comparable corrosion resistance, in their as-deposited condition, to the conventionally anodized and sealed samples which had been processed through two steps.

Possibly the most significant characteristic established for the films was the wear resistance. A modified Taber abrasion test based on Military Specification MIL-A-8625F, "Anodic Coatings for Aluminum and Aluminum Alloys", was developed for the lighting industry to determine the wear resistance of thin, unsealed, conventionally anodized film. For the modified test, the samples were prepared for wear testing as they are for the typical Taber test and the infinite contact resistance of the film was established with an ohmmeter. Testing proceeded with CS-17 abrasive wheels and a 1000 gram load, and was interrupted at 400 cycle intervals to check for electrical continuity. Testing was stopped when a measurable drop in resistance was measured, signifying the anodic coating had worn through, exposing the electrically conductive aluminum base metal.

Previous modified Taber abrasion testing on unsealed, conventionally anodized films at a thickness of 0.00011 inches exhibited wear resistance of 1600 cycles to continuity. Modified Taber abrasion testing on a codeposited anodized panel (with 0.05M aniline monomer in 2M sulfuric acid electrolyte) at a thickness of 0.00015 inches exhibited wear resistance of 4000 cycles to continuity.

A codeposited anodized panel at a thickness of 0.00051 inches was tested following the modified Taber Abrasion test procedure. Testing exceeded the 4000 cycles demonstrated by the thinner sample and was allowed to proceed to 10,000 cycles (the standard number of cycles for hard coat anodized samples) without the coating wearing through.

Metallographic examination determined approximately 0.0002 inches of the coating had worn through testing. Comparative SEM examination in the wear area to an untested area on the same panel determined the surface appeared uniformly worn with no evidence of chipping, peeling, galling or fracture. This was further proof of the excellent adhesion of the film. The smooth appearing surface suggests the polymer phase imparts lubricity to the surface, enabling resistance to wear. The finer microstructure displayed by the codeposited films coupled with the excellent adhesion contributes to wear resistance because the characteristics apparently increased the internal toughness of the finished films.

Codeposited aluminum alloy 5657 panels (0.05M aniline in 2M sulfuric acid) at thicknesses of 0.00015, 0.0003, and 0.0005 inches were subjected to reflectivity testing. Whereas an initial decrease in reflectivity was noted from the uncoated to the coated panels, the readings stabilized with increasing thickness. The distinctiveness of the image was also determined to be a consistent 99%. This finding was surprising as standard anodic films display a continuous decrease in reflectivity as thickness increases. The stability in the reflectivity data for the codeposited films is attributed to the fine-grained microstructure of the codeposited films.

Dye Stain Resistance testing per ASTM B136 was performed on codeposited samples at thicknesses of 0.00015, 0.0003 and 0.0005 inches. After a 5 minute exposure to a drop of Nitric acid, per the specification, the films readily accepted dye. This is not considered a favorable response for sealed anodic films. However, it is hypothesized that the codeposited polyaniline phase within the coating may be soluble in nitric acid, and the test may be inappropriate for evaluating serviceability and application of the finished codeposited films. An interesting characteristic established by this test is the manner in which the films readily accepted the dye after acid exposure. Corresponding areas on the same panels that were not exposed to the acid drop were tested for dyeability by directly placing a drop of dye on the surface of the films. After allowing the dye to remain on the surface for five minutes, it was gently wiped away. The films readily accepted dye without the acid treatment. This indicated that the polyaniline phase within the Boehmitic structure absorbs dye, which suggests that the coating can be used for decorative applications.

The results indicate favorable engineering characteristics, especially in adhesion and wear resistance for the codeposited films. Additional research and development is necessary to ascertain the characteristics of the electropolymerized seal.

Discussion of Characterization Results

The previous analyses determined the codeposition process yields uniform and continuous two-phase films. Imaging within the SEM and TEM document the interfacial aluminum oxidation (anodization) reaction proceeds as polyaniline reacts with and deposits out to become part of the anodic film.

CV of polyaniline on platinum electrodes determined the polymer is not significantly degraded by the codeposition process parameters. All phases of polyaniline were produced by cycling "codeposited" films through their characteristic voltage ranges. Furthermore, FT-IR determined conclusively that a phase of polyaniline, with absorbance bands characteristic of the emeraldine phase (oxidation state) were consistently formed both on the platinum electrodes and within the codeposited films.

EELS data also supports the microscopic imaging results that polymer deposition proceeds as the aluminum oxide film grows. It also determined a significant decrease in oxygen in the dual phase region of the composite film. This strongly suggests that reductive dissolution of the oxide film is proceeding during anodization, offering attachment sites to dope and oxidize (polymerize) the aniline monomer in the electrolyte.

It is well documented that the success of the aluminum anodization process depends upon the solubility of the forming oxide film within the electrolyte, whereby the electrolyte can continually react with the substrate through pores that form, through dissolution, in the resultant oxide film. It is also documented that aluminum sulfite ion is discharged at the base of the pores which form in the film. With the addition of ring-sulfonated aniline to the electrolyte, it is theorized and proven analytically that a reaction between the ring-sulfonated aniline and aluminum sulfite ion proceeds following a mechanism in which the organic monomer is oxidized (polymerized) while the metal oxide is being dissolved. See Lagdlund, M. et. al., Electronic and Chemical Structure of Conjugated Polymers and Interfaces as Studied by Photoelectron Spectroscopy, Preprint from Handbook of Conducting Polymers ($2^{nd}$ ed. 1996), Stone, A.T. et. al., Reductive Dissolution of Metal Oxides In Aquatic Surface Chemistry et. al., pp 221–254, John Wiley & Sons, N.Y. (1987); Huang, C. L. et. al., Coating of Uniform Inorganic Particles et. al., Journal of Colloid and Interface Science, 170, pp 275–283 (1995), the disclosures of each of which are hereby incorporated by reference herein.

It is proposed that electroactive sulfite ions attached to the backbone of the polyaniline chain react with the products of oxide film dissolution (and/or aluminum sulfite ions discharged at the base of the pores in the Boehmitic structure react with the aniline monomer) to form a nonprotonated aluminum salt of polyaniline which is therefore chemically bound to the pores of the Boehmitic structure. Because of the $3^+$ functionality of aluminum, this resultant salt is a large molecule, which by virtue of its attachment to the oxide structure, dilates the pores of the anodic film, resulting in correspondingly thicker films due to its inclusion. The resultant composite films are therefore completely metallurgically bound to the aluminum substrate (aluminum-to-aluminum oxide) and internally chemically bound (aluminum oxide-to-nonprotonated aluminum salt of polyaniline). As the films become thicker, and the polymer reaction product dominates the composite structure, there will be correspondingly more polymer and less nonprotonated salt at the film surface.

The films yielded by simultaneous aluminum anodization and deposition of ring-sulfonated polyaniline (an electroactive polymer) exhibit uniform and continuous structures which are of thicknesses which significantly exceed calculated thicknesses of conventionally anodized films processes for similar times and current densities. This is due to the deposition of the electroactive polymer within the Boehmitic structure as aluminum anodization proceeds. This shows that the polyaniline reacts with the aluminum oxide, forming a completely integrated two-phase composite film with a fine microstructure. The thickness of the composite film varied with the amount of available aniline in the electrolyte; films were correspondingly thinner with less available aniline in solution. In practice, therefore, consideration must be given to the increase in film growth rate with the aniline addition to the electrolyte.

The engineering significance of the film microstructure is the formation of an adherent, corrosion and wear resistant film in one step. Adhesion and corrosion resistance is comparable to conventionally anodized and sealed films processed through two steps. Adhesion is the same because the substrate-film bond is essentially unchanged by the codeposition process. Corrosion resistance is achieved in one step because the nonprotonated aluminum salt of polyaniline "lines and plugs" the pores of the Boehmitic structure. Wear resistance of the codeposited films is superior to conventionally anodized films. This is because of the synergistic effects of the multiphase composite structure. The polymer-rich surface is softer than the underlying composite and is self-lubricating; the harder underlying composite is tough and durable.

Summary and Discussion

An anodic coating process has been theorized and experimentally proven which enables the formation of composite polymer-aluminum oxide films on an aluminum substrate. The key to the process is the modification of the anodizing electrolyte to include aniline monomer. The amino-benzene (polyaniline) structure can be made electroactive, that is, conductive, through ring substitution in a protonic acid. The protonic acid in this process is sulfuric acid.

The polymerization process for polyaniline is oxidative. Electrochemical studies have shown that the polymer exhibits linear relationships between voltage and current (Tafel behavior), a characteristic necessary for electroplating. These characteristics indicated that the electrodeposition/polymerization reaction for polyaniline was anodic in nature. Aluminum metal is commonly anodized in sulfuric acid electrolytes to form stable oxide films on the surface for a variety of industrial applications.

It has been determined that the two reactions of aluminum anodization and deposition of the polyaniline from the electrolyte would occur simultaneously for the following reasons:

Solubility of polyaniline within sulfuric acid

Ring-substitution reaction that sulfonates the polyaniline molecule into an electroactive state Electropolymerization of polyaniline occurs anodically The same electrolyte can be used with both aluminum anodization and the electrodeposition of ring-sulfonated polyaniline Consistent, uniform and continuous films were formed through the codeposition process. Through manipulation of the process parameters it was shown that the electroactive polymer was indeed deposited into the aluminum oxide structure as it was formed on the surface of the aluminum substrate. The resultant composite films exhibited a dual phase structure; aluminum oxide with a noncrystalline translucent polymer phase. Analysis determined the polymer phase was an aluminum-polyaniline reaction product, most likely a nonprotonated, ring-sulfonated, aluminum salt of polyaniline. These results determined the modification of the anodizing electrolyte by addition of aniline monomer, and the codeposition process, formed a completely chemically bound structure: the aluminum oxide constituent is metallurgically bound to the substrate and a nonprotonated, ring-sulfonated, aluminum-polyaniline salt is chemically bound to the aluminum oxide structure.

Engineering characterization of the codeposited films determined the coatings are adherent and exhibit comparable corrosion resistance and superior wear resistance to sealed, conventionally anodized layers. Further, initial experimentation with electropolymerization of polyaniline over anodized or codeposited films to yield a chemically bound ideal polymer-to-metal bond shows merit.

Process Considerations

The approach to process development was with the intention to provide an electrolyte formulation and procedure which would be practical and easy to implement in industry. The solubility of aniline in sulfuric acid at the experimental concentrations yielded a formulation that was initially stable and easy to use. Over time and with use, the polymer was found to spontaneously polymerize, although it remained in solution, decreasing its efficiency. The consumption rate of electroactive polymer was determined by way of HPLC to be approximately 13% with each codeposition run of one (1) hour. Therefore, corresponding additions of aniline to the determined amount of aniline depletion per run were found to be necessary to maintain not only the level of codeposited polymer but to maintain the efficiency of the electrochemical reaction.

Upon consideration of the possible toxicity of the aniline monomer and waste management, a literature search was performed to investigate other uses for polyaniline. It was found that polyaniline has been in use for over 100 years as dyes for a variety of fabrics, including leather. Furthermore, sulfonated polyaniline (specifically, the amide of sulfanilic acid) has considerable medical importance as a class of antibiotics known as the sulfa drugs. Morrison, R. T. et. al., Organic Chemistry, Allyn and Bacon, Boston (1973).

With the long term history of successful use of polyaniline, as well as the knowledge that aniline spontaneously oxidatively polymerizes, it is believed that no significant level of toxicity can be associated with the use of polyaniline. However, care should be exercised in handling the aniline monomer to avoid direct contact, because of its level of reactivity (oxidation).

The consistency of the coatings obtained through the codeposition process, the identification of side reactions which occur during processing as well as a method to overcome its effects, determined the reaction is repeatable and controllable. By acknowledging the reactivity of the aniline monomer (and sulfuric acid) and handling the formulation with care, especially when making the monomer additions, the formulation should also be safe to use. Waste treatment should not be difficult as aniline spontaneously polymerizes, and once bound, is extremely stable.

To compare the codeposition process to existing processes, the aspects of corrosion resistance, wear resistance and the number of process steps were considered. Depending upon the application, corrosion resistance of conventionally anodized films is achieved through sealing, at minimum, through exposure to steam (boiling water). Wear resistance of conventionally anodized films is enhanced by various fluoropolymer post-anodizing surface treatments.

The codeposition process yields completely bound and fully integrated composite films in one step. No other known existing anodic process utilized to coat aluminum is believed to do this. The reduction in the amount of processing steps by codeposition can therefore potentially reduce time and cost, while providing a film that exhibits comparable corrosion resistance and superior wear resistance. By fully developing the electrochemical seal, it is possible that an additional step will enable complete chemical bonding of a polymer-to-metal laminate. Furthermore, as the seal would retain the characteristics of the polyaniline as deposited, the chemically bound surface could possibly be electrically conductive, adding to potential applications.

Alternatives And Potential Other Applications

An anodic coating process has been theorized and experimentally proven which yields composite polymer-metal oxide films on an aluminum substrate. Important to the process is the modification of the anodizing electrolyte by addition of aniline monomer. The amino-benzene structure can be made electroactive, that is, conductive, through ring substitution in a protonic acid. The protonic acid in this process is sulfuric acid. The composite nature of the film has been scientifically characterized and indicates the following structure: the aluminum oxide constituent is metallurgically bound to the substrate and a ring-sulfonated, nonprotonated aluminum-polyaniline salt is chemically bound to the Boehmitic structure of the aluminum oxide. The resultant coating is adherent and exhibits comparable corrosion resistance and superior wear resistance to sealed, conventionally anodized layers. The finished film can be coated via electropolymerization techniques with electroactive polyaniline to yield a chemically bound surface-conductive composite film.

While the focus of this application has been on the development of polymer-metal oxide composite films on aluminum, it will be appreciated that the solubility of aniline in protonic acids other than sulfuric acid indicates the possibility of using other electrolytes such that similar composite films can be developed, using the single step process of the present invention, on other metallic substrates (e.g., copper, steel, silicon, zinc, magnesium or titanium). For example, with silicon, a composite film with silicon dioxide could be formed. This increases the potential uses for the process.

Applications of such a composite interface are currently believed to be far reaching. As a stand-alone film, the coatings exhibit excellent clarity and reflectivity as well as corrosion resistance, which are the desired characteristics for aluminum coil product used in the lighting industry. The coatings also readily accept dye, making them desirable for architectural and other decorative applications. Most significantly, for aluminum products that are normally hard-coat anodized, the fully integrated, homogeneous finish formed with polyaniline exhibits outstanding wear resistance in a single-step process. Any product which relies on a laminate polymer-metal structure, such as gaskets, capacitors, hydraulic tubing, piston-and-bearing components, fuel pumps, circuit boards or various types of sensors, may potentially be produced for less expense, and result in a more reliable product, using the codeposition, single-step coating process of the present invention. As a further example, products which require a reliable polymer-to-metal bond, conductive or otherwise, may benefit from the use of the process of the present invention. Also, the modification of the conventional anodic film microstructure, using the present invention, to yield a dense, wear and corrosion resistant film without requiring a secondary sealing operation might eliminate the need for supplementary sealing baths, reducing time and cost. Wear and corrosion resistance may exhibit the most significant impact as the conductive nature of the aniline within the electrolyte yields a fully integrated film structure, with the polymer codeposited into the anodic film.

As a composite interface, placed to facilitate polymer-to-metal bonding, direct bonding of other polymers to active sites on the polyaniline backbone will improve adhesion of laminate structures, such as gaskets, capacitors, circuit boards, and decorative laminated products. Additional research and development is necessary to develop these characteristics through electropolymerization of polyaniline over the codeposited coating.

This description of the preferred embodiment of the invention has focused on the codeposition of conductive polyaniline during the aluminum anodizing process, and the use of sulfuric acid as an electrolyte. This is due in part to the well understood structure of anodized films on aluminum, and the well documented solubility of aniline monomer in sulfuric acid. Once the principles of the present invention are understood, however, those of ordinary skill in the art will appreciate that it may be possible to employ conductive polymers other than polyaniline into the anodizing electrolyte, i.e., other polypyrole polymers that can be doped into a conductive state. Also, since aniline exhibits good solubility in other acid solutions as well as those incorporated during anodizing, it may be possible to develop similar composite films on steel, silicon or other metallic substrates, using either aniline or another monomer, with the intent to electropolymerize for the purpose of the formation of composite polymer-metal oxide films.

Three basic processes have been described: (1) standard and hard coat anodization; (2) electropolymerization of polyaniline from an acid electrolyte onto a metal electrode; and (3) codeposition of a polyaniline phase or oxide state during aluminum anodization. Of these basic processes, the third is the focus of the present invention. Consistent with the principles of the codeposition process disclosed here, the codeposition process can be modified to yield at least five types of duplex films:

1) Standard anodic film+codeposited film
2) Hard coat anodic film+codeposited film
3) Codeposited film+electropolymerized film
4) Standard anodic film+electropolymerized film
5) Hard coat anodic film+electropolymerized film In all cases, the intent of the process(es) is to produce adherent, wear-resistant and corrosion-resistant films. Applications which utilize these characteristics, especially wear resistance, are not believed to be addressed by the prior art, even with electro-polymerization processes. Consideration must also be given to what favorable properties may be obtained with electropolymerization of polyaniline on the surface of duplex film types 1) and 2), above, forming a third, discrete layer of polymer.

Of course, it should be understood that various changes and modifications to the preferred embodiments described herein will be apparent to those skilled in the art. Examples of such modifications are provided in the preceding section. Such modifications and changes can be made to the illustrated embodiments without departing from the spirit and scope of the present invention, and without diminishing the attendant advantages. It is, therefore, intended that such changes and modifications be covered by the following claims.

We claim:

1. An anodization process for forming a composite film on a metallic substrate, comprising the steps of anodizing the metallic substrate thereby forming an anodic film, and simultaneously depositing a polymer or polymer phase within the anodic film to thereby form the composite film, wherein the anodizing and depositing steps employ an electrolyte including conductive polymer and a an oxidizing agent consisting of protonic acid solution.

2. An anodization process for forming a metal oxide-polymer codeposited composite film on a metallic substrate, comprising the steps of:

providing an anodizing electrolyte including an oxidizing agent consisting of a protonic acid solution;

incorporating a conductive polymer or polymer phase in the electrolyte by the addition of a monomer; and anodizing the metallic substrate while immersed in the polymer containing electrolyte to produce a metal oxide film while simultaneously depositing the conductive polymer or polymer phase within the metal oxide film, to thereby form the composite film on the substrate.

3. The anodization process of claim 2, further comprising the step of electropolymerizing a generally discrete polymer film onto the surface of the composite film to produce a completely sealed, polymer film on the surface of the codeposited composite film.

4. The anodization process of claim 3, wherein the electropolymerized polymer is an emeraldine phase of polyaniline.

5. The anodization process of claim 2, wherein the monomer addition to the electrolyte is aniline.

6. The anodization process of claim 2, wherein the conductive polymer consists of one of the conducting oxides states of polyaniline.

7. The anodization process of claim 2, wherein the electrolyte is based in or includes a mixture of one or more of the following protonic acids: sulfuric acid; methyl sulfonic acid; chromic acid; oxalic acid; or phosphoric acid.

8. The anodization process of claim 2, wherein the metallic substrate is selected from one or more of the following metals: aluminum; silicon; zinc; magnesium; or titanium.

9. The anodization process of claim 2, wherein the resulting codeposited composite film has wear-resistant properties exceeding those of the metal oxide film alone.

10. The anodization process of claim 2, wherein a nonprotonated ring-substituted aluminum salt of polyaniline is deposited within the metal oxide film.

11. The anodization process of claim 10, wherein the substrate is aluminum and the aluminum oxide film has a columnar Boehmitic structure.

12. A process for forming a metal oxide-polymer codeposited film on a metal substrate, comprising the step of:

immersing the metal substrate in a bath containing a protonic acid and a conductive polymer or polymer phase;

applying an electric potential to the bath and substrate for a time sufficient to form an anodic metal oxide film on the substrate while simultaneously depositing the polymer or polymer phase within the anodic film to thereby form a composite film, the polymer or polymer phase being chemically bound to the metal oxide film, and continuing to apply the electric potential to the substrate and bath for a time sufficient to establish an outer layer on the composite film that is substantially all polymer or polymer phase.

13. An anodization process for forming an aluminum oxide-polyaniline codeposited composite film on an aluminum based substrate, comprising the steps of:

providing an anodizing electrolyte including an oxidizing agent consisting of a protonic acid solution modified by the addition of an aniline monomer;

immersing an aluminum or aluminum alloy substrate in the electrolyte;

anodizing the substrate to produce an aluminum oxide film while simultaneously depositing an aniline or aniline phase within the aluminum oxide to thereby form the composite film and wherein said anodizing is conducted at a steady state current density.

14. The anodization process of claim 13 wherein the aluminum oxide is metallurgically bound to the aluminum or aluminum alloy substrate and the aniline or aniline phase is chemically bound to the aluminum oxide.

* * * * *